(12) United States Patent
Xiao

(10) Patent No.: US 7,525,811 B2
(45) Date of Patent: Apr. 28, 2009

(54) RETENTION DEVICE FOR SECURING EXPANSION CARD SHIELDS

(75) Inventor: Yu-Ming Xiao, Shenzhen (CN)

(73) Assignees: Hong Fu Jin Precision Industry (ShenZhen) Co., Ltd., Shenzhen, Guangdong Province (CN); Hon Hai Precision Industry Co., Ltd., Tu-Cheng, Taipei Hsien (TW)

( * ) Notice: Subject to any disclaimer, the term of this patent is extended or adjusted under 35 U.S.C. 154(b) by 145 days.

(21) Appl. No.: 11/753,583

(22) Filed: May 25, 2007

(65) Prior Publication Data

US 2008/0212295 A1    Sep. 4, 2008

(30) Foreign Application Priority Data

Mar. 1, 2007    (CN)    ......................... 2007 2 0200110

(51) Int. Cl.
    *H05K 5/00*    (2006.01)
(52) U.S. Cl. ................... 361/759; 361/784; 361/728
(58) Field of Classification Search ............... 361/600,
    361/683, 686, 679, 728, 736, 740, 752, 754,
    361/759, 784, 790, 796, 797, 800, 801, 816,
    361/818
    See application file for complete search history.

(56) References Cited

U.S. PATENT DOCUMENTS

| 5,936,835 | A | 8/1999 | Astier | |
|---|---|---|---|---|
| 6,480,393 | B1 * | 11/2002 | Chen | ......................... 361/759 |
| 6,549,398 | B2 * | 4/2003 | Chen | ......................... 361/683 |
| 6,834,766 | B2 * | 12/2004 | Lin et al. | .................. 211/41.17 |
| 6,999,311 | B1 * | 2/2006 | Lai | ............................. 361/685 |
| 7,254,041 | B2 * | 8/2007 | Chen et al. | .................. 361/801 |

\* cited by examiner

*Primary Examiner*—Hung S Bui
(74) *Attorney, Agent, or Firm*—Frank R. Niranjan

(57) ABSTRACT

A retention device for securing expansion card shields (30) includes a chassis (10), and a lock member (20) for securing the expansion card shields to the chassis. The chassis includes a rear panel (12) with a flange (14) extending therefrom, and a holder bracket (123). At least a pivot slot (141) including an entrance portion (141*a*) and a pivot portion (141*b*) is defined in a junction area of the rear panel and the flange. The lock member has at least a pivot hook configured for being pivotally engaged in the pivot slot of the chassis. After the pivot hook of the lock member is inserted into the entrance portion of the pivot slot and slid to the pivot portion, the lock member can be rotated to a locked position for securing the expansion card shields on the holder bracket of the chassis.

16 Claims, 5 Drawing Sheets

RETENTION DEVICE FOR SECURING EXPANSION CARD SHIELDS

BACKGROUND OF THE INVENTION

1. Field of the Invention

The present invention is generally related to retention devices, and in particular to a retention device for expansion card shields.

2. Description of Related Art

With continued development of computers, a wide variety of optional extra devices are available for adding to a computer to increase its performance and functions. Expansion cards are the most common add-on devices used to enhance computers. Almost all computers use a variety of expansion cards such as network cards, sound cards, and SCSI cards. Consequently, a typical chassis is configured to have a number of expansion slots that allow users to install optional expansion cards.

Conventionally, one end of an expansion card is mounted in an expansion card slot on a motherboard, a shield connected with another end of the expansion card is secured to a chassis by bolts. Each expansion card shield needs one bolt. Fastening or unfastening the bolts is unduly time-consuming and laborious, retarding the efficiency of installation and/or removal of the expansion cards. This problem is multiplied in mass production facilities, and results in increased costs.

What is needed, therefore, is a retention device for readily mounting expansion card shields.

SUMMARY OF THE INVENTION

A retention device for securing expansion card shields includes a chassis, and a lock member for securing the expansion card shields on the chassis. The chassis includes a rear panel with a flange extending therefrom, and a holder bracket. At least a pivot slot including an entrance portion and a pivot portion is defined in a junction area of the rear panel and the flange. The lock member has at least a pivot hook pivotably engaged in the pivot slot of the chassis. Wherein after the pivot hook of the lock member is inserted into the entrance portion of the pivot slot, the lock member slides along the entrance portion until it engages in the pivot portion of the pivot slot, and then rotates to a locked position for securing the expansion card shields on the holder bracket of the chassis.

Other advantages and novel features will be drawn from the following detailed description of preferred embodiments with attached drawings, in which:

DETAILED DESCRIPTION OF THE INVENTION

Figure 1:
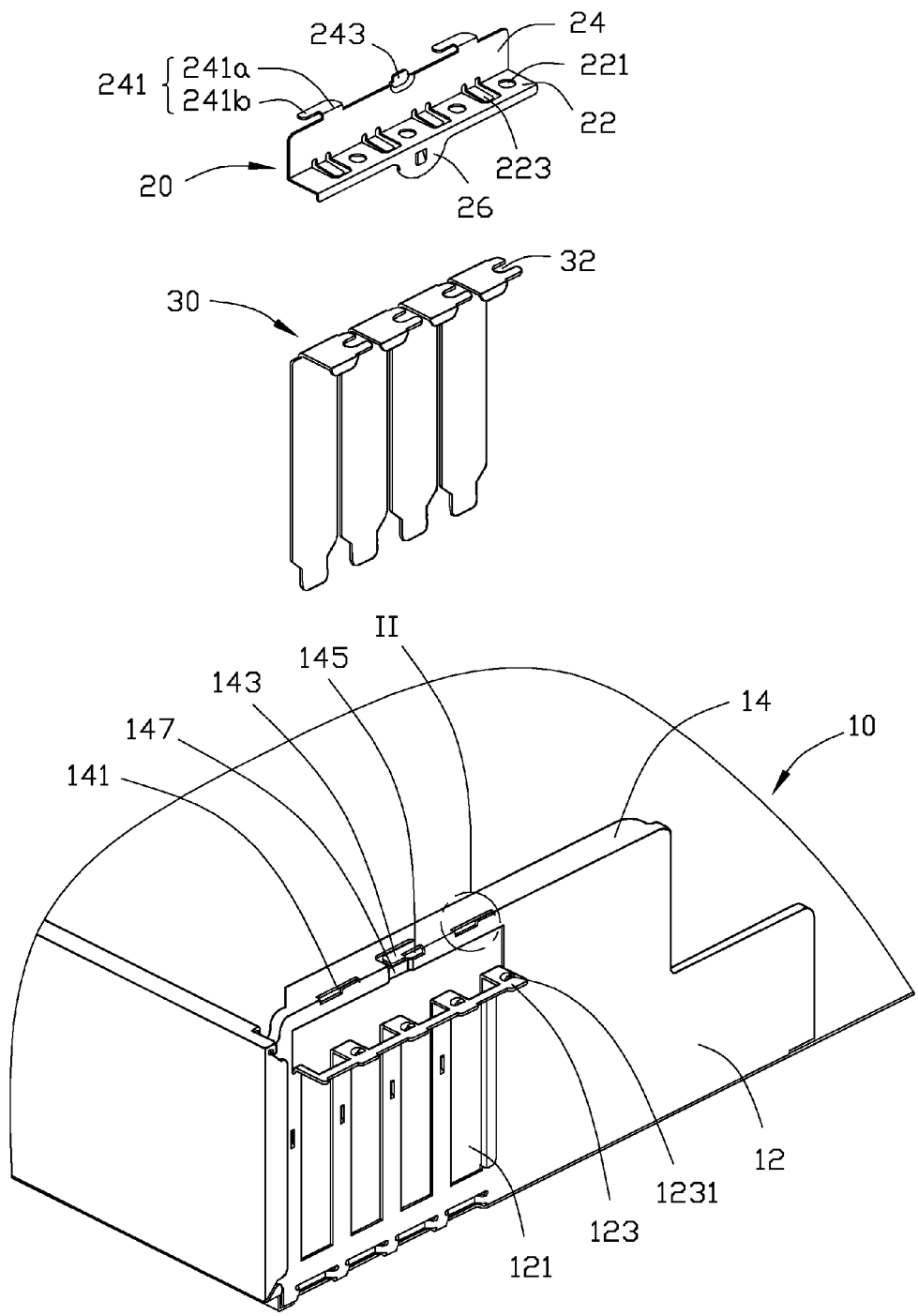
FIG. 1 is an exploded, isometric view of an expansion card shields retention device of a preferred embodiment of the present invention, together with a plurality of expansion card shields; the expansion card shields retention device comprising a chassis, and a lock member.

Referring to FIG. 1, a retention device for expansion card shields of a preferred embodiment of the present invention is shown together with a plurality of expansion card shields 30; the retention device comprises a chassis 10, and a lock member 20.

Figure 2:
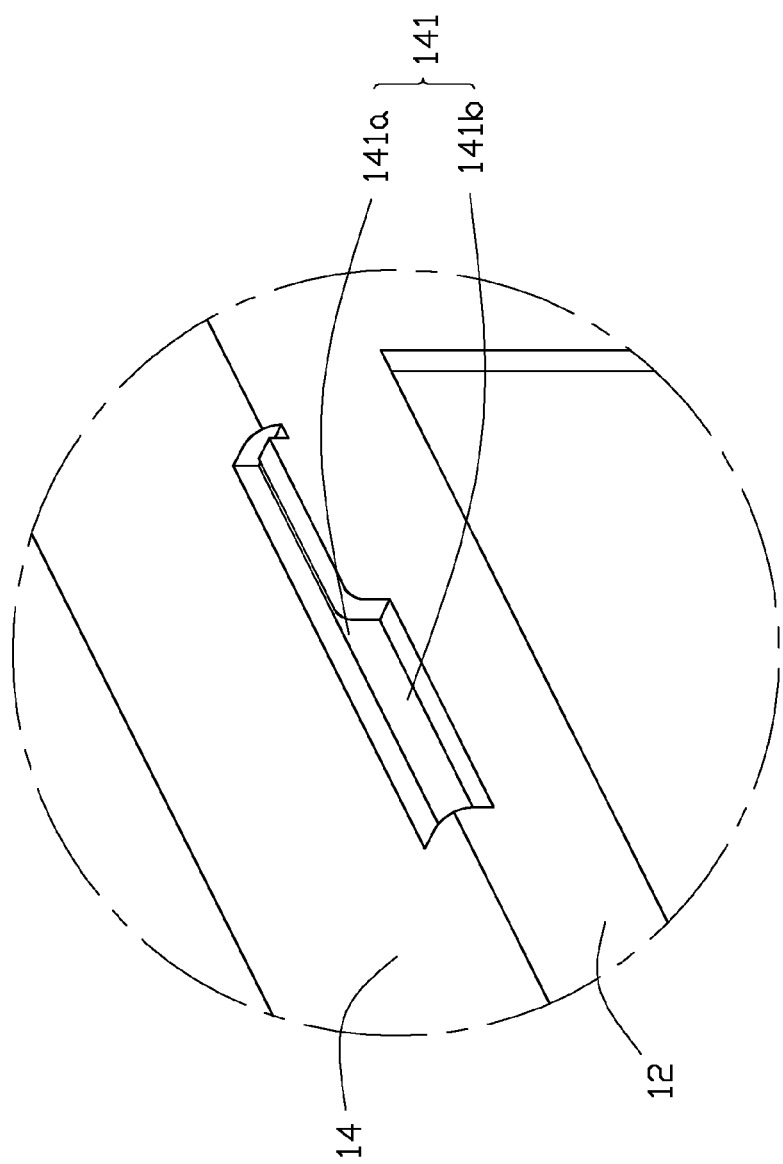
FIG. 2 is an enlarged view of an encircled portion II of FIG. 1.

Referring to FIG. 1 and FIG. 2, the chassis 10 includes a rear panel 12, and a flange 14 extending inward from a top edge of the rear panel 12. A holder bracket 123 of the rear panel 12 is configured for holding the expansion card shields 30. A plurality of equidistantly spaced protrusions 1231 are formed on a top flange of the holder bracket 123, and a plurality of card slots 121 is defined in the holder bracket 123 between the protrusions 1231 respectively. A pair of pivot slots 141 is defined in a junction area of the rear panel 12 and the flange 14 of the chassis 10. Each pivot slot 141 includes a longer entrance portion 141a defined in the flange 14, and a shorter pivot portion 141b defined in the rear panel 12 connecting with the entrance portion 141a. A flat resisting piece 143 is formed in the flange 14 of the chassis 10. A sunken portion 147 under the resisting piece 143 is formed in a top portion of the rear panel 12, and an opening 145 is formed near the resisting piece 143 and the sunken portion 147.

Figure 3:
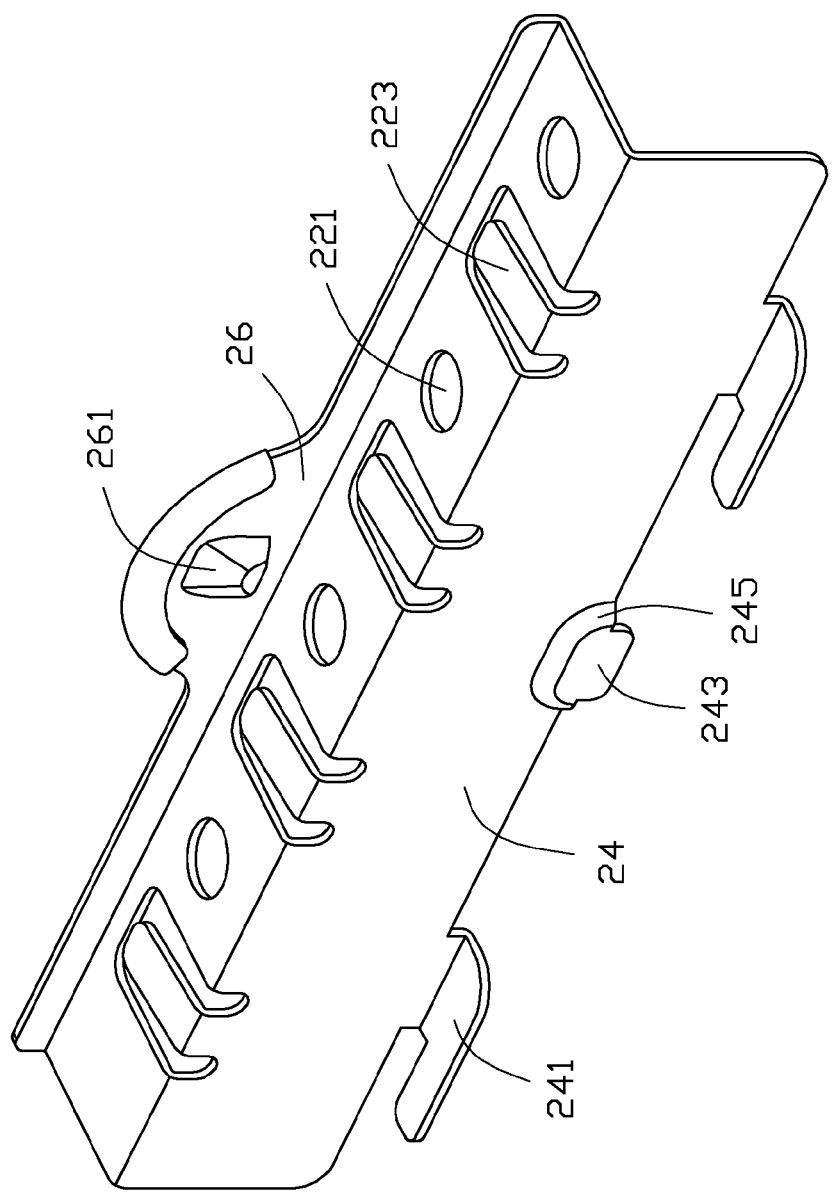
FIG. 3 is an enlarged view of the lock member in FIG. 1, but viewed from another aspect.

Referring to FIG. 1 and FIG. 3, the lock member 20 includes a side plate 24, and a bottom flange 22 extending perpendicularly from a bottom edge of the side plate 24. A pair of pivot hooks 241 corresponding to the pivot slots 141 extends from a top edge of the side plate 24. The pivot hooks 241 each include a neck 241a corresponding to the pivot portions 141b of the pivot slots 141, and a hook 241b corresponding to the entrance portions 141a of the pivot slots 141. A length of each entrance portion 141a of the pivot slots 141 is not less than that of the hooks 241b of the pivot hooks 241 for allowing entrance of the hooks 241b. A length of each pivot portion 141b of the pivot slots 141 is also not less than that of the necks 241a. A tongue piece 243 between the pivot hooks 241 corresponding to the resisting piece 143 extends upwards from the top edge of the side plate 24. A plurality of securing holes 221 corresponding to the protrusions 1231 of the holder bracket 123 of the chassis 10 are defined in the bottom flange 22 of the lock member 20, and a plurality of cantilevers 223 are formed in the bottom flange 22. A resilient handle 26 extends from an edge of the bottom flange 22 downwards and perpendicularly, and a clip 261 is formed on a backside of the resilient handle 26.

The expansion card shields 30 each include a head with a cut hole 32 defined therein corresponding to one of the protrusions 1231 of the chassis 10 and a corresponding one of the securing holes 221 of the lock member 20.

Figure 4:
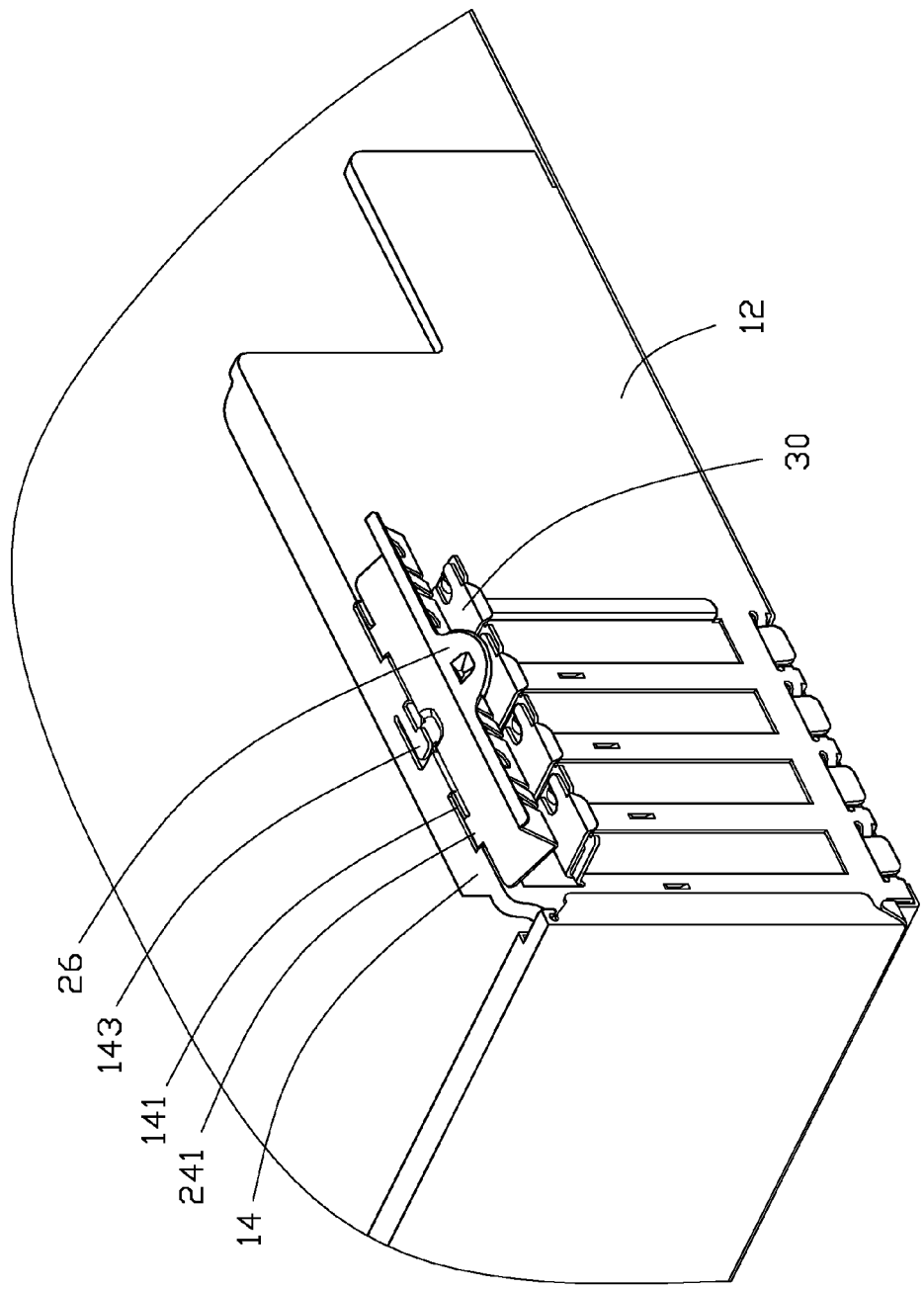
FIG. 4 is a pre-assembled view of FIG. 1.
Figure 5:
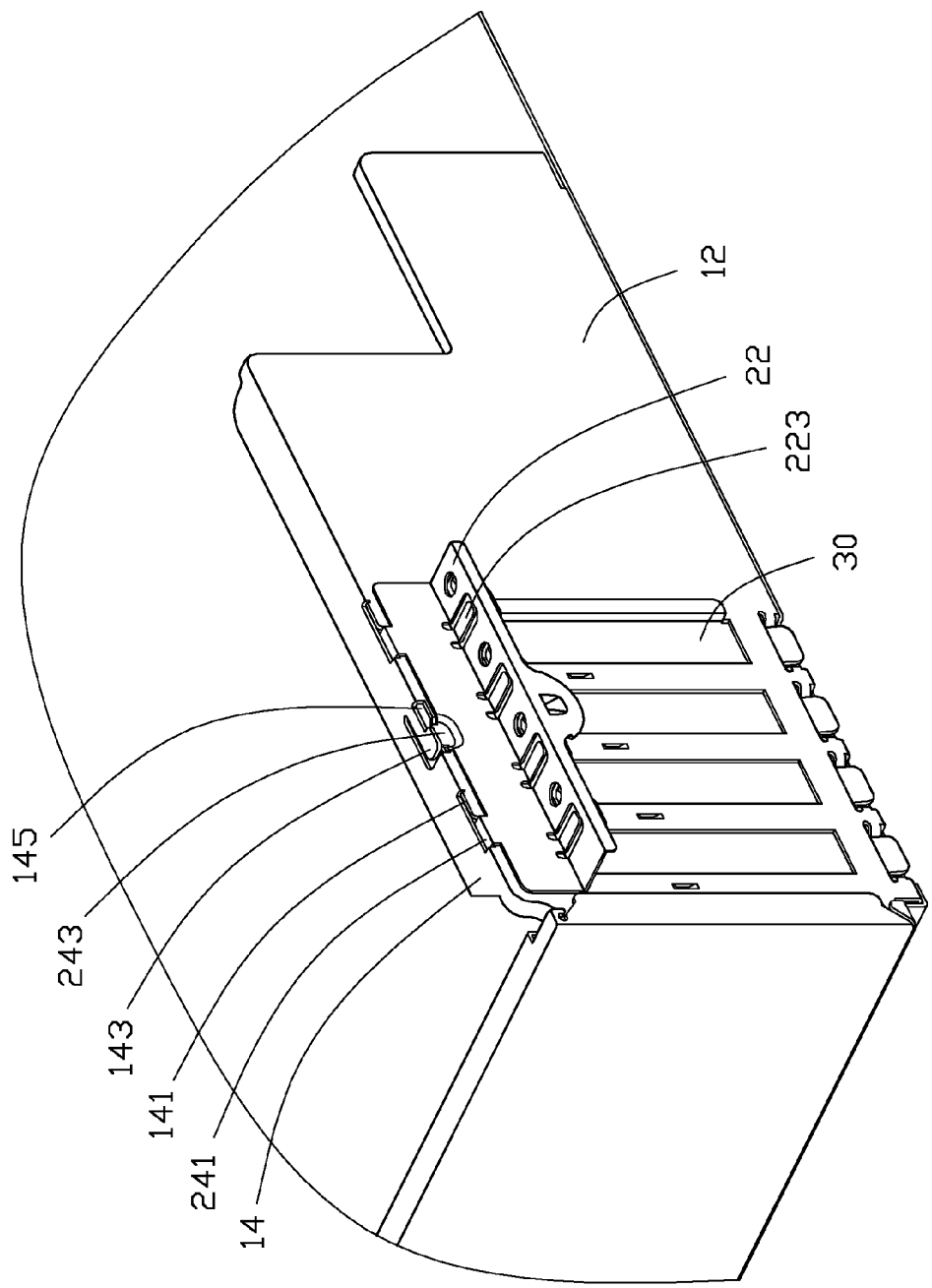
FIG. 5 is an assembled view of FIG. 1.

Referring to FIG. 4 and FIG. 5, in assembly, the shields 30 are placed on the holder bracket 123 and the protrusions 1231 of the holder bracket 123 of the chassis 10 extend through the cut holes 32 of the expansion card shields 30 respectively, and the expansion card shields 30 cover the card slots 121 respectively. Then the pivot hooks 241 of the lock member 20 are inserted downwards to the pivot slot 141 of the chassis 10 from the entrance portions 141a of the pivot slots 141 along a first direction perpendicular to the flange 14 of the chassis 10, and the tongue piece 243 of the lock member 20 is inserted into the opening 145 of the chassis 10 simultaneously along a second direction parallel to the flange 14 of the chassis. Afterwards, the lock member 20 slides leftwards along the pivot slots 141 until the necks 241a of the pivot hooks 241 engage with the corresponding pivot portions 141b of the pivot slots 141 respectively, and the tongue piece 243 of the lock member 20 slides to a position under the resisting piece 143 of the chassis 10. Then the lock member 20 is rotated downwards until it reaches a locked position where the securing holes 221 of the lock member 20 engage with the protrusions 1231 of the holder bracket 123 of the chassis 10, the clip 261 of the resilient handle 26 of the lock member 20 catches a lower backside of the top flange of the holder bracket 123, the cantilevers 223 of the lock member 20 resist on the heads of the expansion card shields 30, the side plate 24 of the lock member 20 is generally parallel to the rear panel 12 of the chassis 10 and the resisting piece 143 resists perpendicularly on the tongue piece 243 of the lock member 20 which engages in the sunken portion 147 of the chassis 10 to prevent the lock member 20 sliding rightward. Thus, the expansion card shields 30 are secured to the holder bracket 123 of the chassis 10.

In disassembly, the resilient handle 26 is pulled outwards until the clip 261 thereof is disengaged from the holder bracket 123. The lock member 20 is rotated upwardly until the bottom flange 22 of the lock member 20 is disengaged from the heads of the expansion card shields 30, thus the expansions card shields 30 are unlocked. After the lock member 20 rotates to an original position where the tongue piece 243 is parallel to the resisting piece 143 of the chassis 10, and the hooks 241b of the lock member 20 are perpendicular to the flange 14 of the chassis 10, the lock member 20 slides rightward until it reaches ends of the entrance portions 141a of the pivot slots 141. Then the lock member 20 is disassembled from the entrance portions 141a of the pivot slots 141 and the opening 145 of the chassis 10.

It is to be understood, however, that even though numerous characteristics and advantages have been set forth in the foregoing description of preferred embodiments, together with details of the structures and functions of the preferred embodiments, the disclosure is illustrative only, and changes may be made in detail, especially in matters of shape, size, and arrangement of parts within the principles of the invention to the full extent indicated by the broad general meaning of the terms in which the appended claims are expressed.

What is claimed is:

1. A retention device for securing expansion card shields comprising:
   a rear panel of a chassis with a flange extending therefrom, a holder bracket being bent from the rear panel configured for holding the expansion card shields thereon;
   at least a pivot slot defined in a junction area of the rear panel and the flange, the pivot slot comprising an entrance portion defined in the flange and a pivot portion defined in the rear panel communicating with the entrance portion; and
   a lock member having at least a pivot hook and a clip;
   wherein the pivot hook of the lock member is insertable into the entrance portion of the pivot slot and slides along the entrance portion until the pivot hook pivotably engages in the pivot portion of the pivot slot such that the lock member is capable of being rotated to a locked position where the clip locks with the holder bracket thereby securing the expansion card shields to the holder bracket of the rear panel.

2. The retention device as described in claim 1, wherein the lock member further has a tongue piece extending upwardly therefrom; a resisting piece perpendicularly resisting on the tongue piece in the locked position is formed flatly in the flange of the rear panel.

3. The retention device as described in claim 2, wherein a sunken portion below the resisting piece is formed in the rear panel for engaging with the tongue piece of the lock member in the locked position.

4. The retention device as described in claim 1, wherein the lock member comprises a side plate and a bottom flange extending perpendicularly from a bottom edge of the side plate, a resilient handle extends perpendicularly and downwards from an edge of the bottom flange, the clip is formed on an inner side of the handle.

5. The retention device as described in claim 4, wherein the pivot hook extends from a top edge of the side plate of the lock member and comprises a neck pivotably received in the pivot portion of the slot in the locked position and a flat hook extending from the neck and capable of entering into the entrance portion of the pivot slot and pivotably engaging with the rear panel in the locked position.

6. The retention device as described in claim 5 wherein a length of the entrance portion of the pivot slot is not less than that of the hook, and a length of the pivot portion of the pivot slot is not less than that of the neck.

7. An expansion card shield retention assembly comprising:
   a chassis comprising a rear panel and a flange bent from the rear panel, the rear panel having a holder bracket, at least a pivot slot being defined in a junction area of the rear panel and the flange, a resisting piece being flatly formed in the flange;
   a lock member comprising at least a pivot hook corresponding to the pivot slot, a tongue
   piece corresponding to the resisting piece of the chassis, and a resilient clip; and
   at least an expansion card shield placed on the holder bracket;
   wherein the pivot hook is insertable into the pivot slot of the chassis to allow the lock member being rotated with respect to the chassis to a locked position where a head of the expansion card shield is sandwiched and secured between the lock member and the holder bracket, the resisting piece of the chassis perpendicularly resists on the tongue piece of the lock member, and the resilient clip catches a backside of the holder bracket.

8. The expansion card shield retention assembly as described in claim 7, wherein the pivot slot of the chassis comprises an entrance portion, and a pivot portion connected with the entrance portion; the pivot hook of the lock member comprises a neck pivotally engaged with the pivot portion of the pivot slot, and a flat hook corresponding to the entrance portion of the pivot slot.

9. The expansion card shield retention assembly as described in claim 8, wherein a length of the entrance portion of the pivot slot is not less than that of the hook of the pivot hook, and a length of the pivot portion of the pivot slot is not less than that of the neck.

10. The expansion card shield retention assembly as described in claim 7, wherein a sunken portion is defined in the rear panel under the resisting piece which is formed flatly in the flange of the chassis, and the tongue piece is engaged with the sunken portion and perpendicularly resisted by the resisting piece in the locked position.

11. The expansion card shield retention assembly as described in claim 10, wherein an opening is defined in the chassis near the resisting piece of the flange and the sunken portion of the rear panel for providing entrance or exit of the tongue piece of the lock member.

12. The expansion card shield retention assembly as described in claim 7, wherein the lock member comprises a side plate and a bottom flange resisting on the head of the expansion card shield in the locked position, the pivot hook is bent from a top edge of the side plate, the tongue piece extends upwardly from the side plate of the lock member.

13. An expansion card shield retention assembly comprising:
- a chassis comprising a panel and a flange bent inward from the rear panel, the rear panel having a holder bracket extending outward therefrom, at least a pivot slot being defined in a junction of the rear panel and the flange, a resisting piece being formed at the flange;
- a lock member comprising at least a pivot hook capable of being inserted into the pivot slot along a first direction perpendicular to the flange, a tongue piece capable of being inserted below the resisting piece of the chassis in a second direction parallel to the flange, and a resilient clip; and
- at least an expansion card shield placed on the holder bracket;
- wherein the pivot hook is pivotable in the pivot slot to allow the lock member being rotated with respect to the chassis to a locked position where one portion of the expansion card shield is sandwiched between the lock member and the holder bracket, the resisting piece perpendicularly resists on the tongue piece of the lock member in the first direction, and the resilient clip catches the holder bracket.

14. The expansion card shield retention assembly as described in claim 13, wherein a sunken portion below the resisting piece is formed in the rear panel configured for engaging with the tongue piece of the lock member in a third direction perpendicular to the first and second directions in the locked position.

15. The expansion card shield retention assembly as described in claim 13, wherein the pivot slot comprises an entrance portion defined in the flange, and a pivot portion defined in the rear panel and communicating with the entrance portion, the pivot hook comprises a neck pivotally received in the pivot portion in the locked position, and an engaging portion extending from the neck and capable of inserting into the entrance portion to engage with the panel and the flange in the locked position.

16. The expansion card shield retention assembly as described in claim 13, wherein the locking member comprises a side plate parallel to the rear panel and a flange extending perpendicularly outward from the side plate, the flange pressing the portion of the shield against the holder bracket in the locked position, the pivot hook extending perpendicularly inward from the side plate.

* * * * *